Dec. 5, 1961 M. SILVERBERG 3,012,207
CONTROLLED PHASE SHIFT OSCILLATOR
Filed March 26, 1959
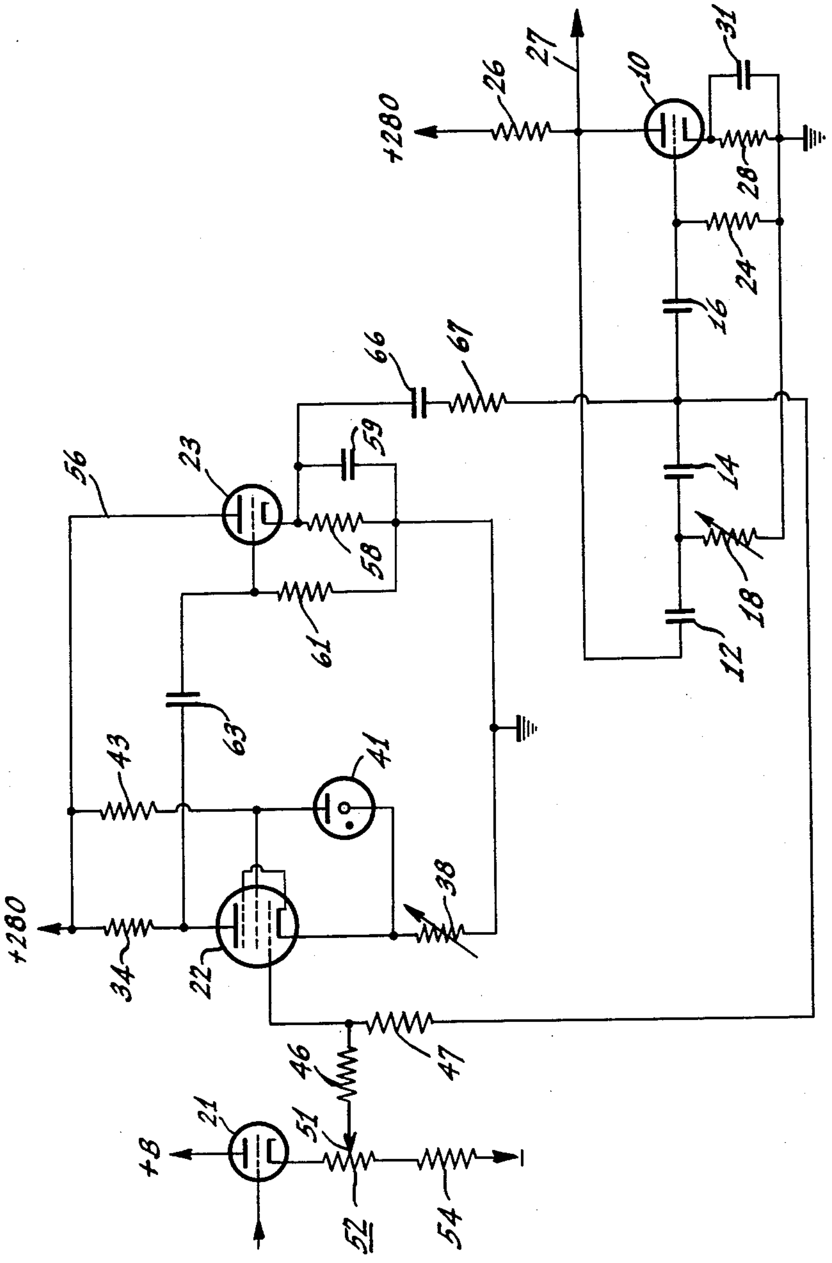
INVENTOR.
MORTON SILVERBERG
BY
Charles H. Brown
ATTORNEY 3,012,207

CONTROLLED PHASE SHIFT OSCILLATOR

Morton Silverberg, Riverton, N.J., assignor to Radio Corporation of America, a corporation of Delaware Filed Mar. 26, 1959, Ser. No. 802,113
4 Claims. (Cl. 331—137)

The present invention relates to controlled oscillators, and more particularly to an oscillator which is controllable in response to a reference signal, so that the phase and frequency of its output varies in accordance with variations in a characteristic of the reference signal.

In accordance with the present invention, an electrically variable oscillator is provided which is capable of wide frequency deviation in response to a control signal with a high degree of sensitivity and frequency response. An oscillator constructed to operate in accordance with the present invention also has a high degree of frequency stability and its output is relatively free from harmonic distortion. Control is effected by a direct current (D.C.) signal which may be derived, for example, from a phase detector. In one use of an oscillator, constructed and controlled in accordance with the present invention, a reference frequency is fed to one terminal of the phase detector and another frequency, which, for example, may be dependent on the instantaneous velocity of the tape in a tape recorder or reproducer, is also applied to the phase detector. The resulting D.C. signal is applied as an oscillator control signal. It will be understood, however, that the previously described use is suggested only by way of example and that the controlled oscillator of the present invention is capable of functioning in a wide variety of settings.

An object of the present invention is to provide a novel oscillator, the phase and frequency of the output thereof being controllable in response to a reference signal.

Another object of the invention is to provide a novel controlled oscillator of the resistance-capacitance type, the phase and frequency of which are controllable by operation of a signal applied in a novel manner to vary the effectiveness of a feedback control network.

Another object of the invention is to provide a novel manner for controlling the frequency of an oscillator through the effect of a variable gain amplifier.

Other objects and advantages of the invention will, of course, become apparent and immediately suggest themselves to those skilled in the art to which the invention is directed from a reading of the following specification in connection with the accompanying drawing which shows, schematically, an electrically variable oscillator constructed in accordance with the present invention.

Referring to the single figure of the drawing, an oscillator, including an electronic amplifier shown by way of example as a vacuum tube 10, is connected in circuit with a phase reversing feedback loop comprising three capacitors 12, 14 and 16. The tube 10, for example, may be one section of a 12AT7 tube. The capacitor 12 is associated with a resistor 18 indicated as being of the variable type. The effective resistance associated with the capacitor 14 will be described more in detail hereinafter in connection with the control network which includes electronic amplifier devices shown by way of example as vacuum tubes 21, 22 and 23. While the term "amplifying device" is used to designate effective circuit elements herein, it will be understood that it embraces an amplifying device having an amplification factor less than unity. The capacitor 16 is associated with a resistor 24. The parts thus far described act as a 180° phase shift network thereby to cause the tube V4 to operate as a resistance-capacitance (R.C.) oscillator.

The anode of the tube 10 is connected through a load resistor 26 to a direct current source (not shown) of suitable voltage. A connection 27 is available for providing an output from the oscillator. This is indicated by way of example on the drawing as having a value of +280 volts. The cathode of the tube 10 is connected by way of a cathode resistor 28 to a circuit reference potential shown, for example, as "ground." The cathode of resistor 28 is shunted by a capacitor 31.

The previously mentioned tubes 22 and 23 are elements of a network which acts as an electrically variable resistor with minimal imaginary components. The anode of the tube 22 is connected by way of a load resistor 34 to the previously mentioned source of positive voltage indicated on the drawing as +280 volts, for example. This voltage source is or may be the same to which the resistor 26 is indicated as being connected. The tube 22 is shown as a pentode and may, for example, be of the 6AU6 type. The cathode of the tube 22 is connected by way of a variable resistor 38 to the previously mentioned reference potential for the circuit. A voltage regulator tube 41, for example an OA2 type, is used to maintain high gain in the tube 22 and to lower the value of the resistor 38 needed to maintain the cathode of the tube 22 at some given positive voltage. To accomplish this, the screen grid of the tube 22 is connected to a point between a resistor 43 and the tube 41. One electrode of the latter is connected to the cathode of the tube 22.

The oscillator signal at the junction of capacitors 14 and 16 is fed back through a voltage divider made up of resistors 46 and 47 to the grid of the tube 22 which serves as the input or signal grid. The impedance at 51 should be less than the value of the resistor 46. The resistor 46 is connected to the slider 51 of a potentiometer 52. The resistor of the potentiometer as well as a resistor 54 is included in the cathode of the circuit of the tube 21, the end of the resistor 54 being connected to a potential negative with respect to ground. The anode of the tube 21 is connected to a positive potential source of suitable value which may be the previously mentioned source or a lower voltage point on the bleeder (not shown) thereof. The voltage between the signal grid and the cathode of the tube 22 is determined by the total input voltage applied thereto and the cathode voltage of this tube as determined by adjustment of the resistor 38. The alternating current (A.C.) signal at the signal grid of the tube 22 is made to be small compared to the grid bias. The gain of the tube 22 is determined by the bias voltage applied to its signal grid, and thus the anode of the tube 22 produces a variable amplitude A.C. signal superimposed on a variable D.C. level. As pointed out in the foregoing, the gain in the tube 22 is maintained at a high level. As indicated previously, a D.C. voltage is applied to the signal grid of the tube 21 and the source of this D.C. signal is one which is to exercise control of the phase and/or frequency of the output wave appearing at the connection 27.

The previously mentioned tube 23 serves as an impedance changer and its anode is connected by way of a conductor 56 to the previously mentioned source of positive potential. The cathode of the tube 23 is connected by way of a resistor 58 to ground. The resistor 58 is shunted by a capacitor 59. The signal grid of the tube 23 is connected to ground by way of a resistor 61. A capacitor 63 couples the anode of the tube 22 to the signal grid of the tube 23.

The cathode of the tube 23 is connected to the point between the capacitors 14 and 16 by way of a coupling capacitor 66 and a resistor 67. The capacitor 63 is a relatively large capacitor and the resistor 67 has approximately twice the value of the normal resistor that would be used in the 180° phase shift resistor. As will be pointed out hereinafter, the apparent resistance of the resistor 67 depends on the signal transmitted from the tube 23. In operation of the illustrative embodiment of the invention shown on the drawing, the impedance seen from the junction of capacitor 14 and capacitor 16 varies from approximately ¼ of the ohmic value of the resistor 67 to its full ohmic value. It is to be noted that there is a considerable amount of negative feedback around the control network to linearize the circuit.

The operation of the illustrative embodiment of the invention, while it is believed to be apparent from the foregoing, will be briefly described. The devices referred to herein as electronic amplifiers are electron discharge devices having, in effect, an emitter of electrons, a collector of electrons, and a control electrode. In the illustrative embodiment of the invention, vacuum tubes are shown. The tube 21 has no separately applied grid bias and the applied control signal swings the grid above and below zero at a frequency depending on the behavior of the apparatus from which the D.C. control signal is derived. As stated in the foregoing, the oscillator of this invention may be used in conjunction with a tape recorder and reproducer, in which case the frequency of the control signal will depend on the tape behavior. The tube 21 does not amplify and serves as an impedance transformer. At the signal grid of the tube 22 two signal components are present. The first is the A.C. signal from the circuit point between the capacitors 14 and 16. The second is the D.C. level at the slider 51 of the potentiometer 52. The peak-to-peak voltage of the A.C. signal is or may be small compared to the change in voltage applied to the signal grid of the tube 21. The tube 22 is a variable gain amplifier, depending on the D.C. level at its signal grid, as pointed out above. If the D.C. level is more plus, then the amplification is greater.

The resistor 43 and the tube 41 serve as a voltage regulator combination for the screen voltage applied to the screen grid of the tube 22, as indicated in the foregoing. This enables the gain of the tube to be held at a maximum value. This permits the greatest possible change in gain and also improves the sensitivity of the gain change. The coupling capacitor 63 and the resistor 61 removes the D.C. component which is put in by the control signal applied to the grid of the tube 21. The resistor 58 and the capacitor 59 correct for the phase shift occurring by reason of the joint operation of the capacitor 63 and the resistor 61. At the capacitor-resistor combination 63 and 61, the voltage through this reactance is leading. At the capacitor-resistor combination 59 and 58, the voltage is lagging by a like amount. The voltage across the combination of the capacitor 59 and the resistor 58 is 180° out of phase with the signal at the circuit point between the capacitors 14 and 16 and remains at 180° for a wide range of input signal at 51. The capacitor 66 has a low capacitive reactance at the oscillator frequency.

The impedance seen at the circuit point between the capacitors 14 and 16 is the ohmic value of the resistor 67 modified by the voltage appearing from the resistance-capacitance combination 58 and 59. This changes the time constant (R.C.) of the combination of the capacitor 14 and the modified resistance of the resistor 67.

The impedance modification is shown by:

$$Z=\frac{V}{I}$$

V is volts at the circuit point between the capacitors 14 and 16 with respect to ground.

I is the current in the resistor 67.

$$I=\frac{V+VG}{r \text{ (of resistor 67)}}$$

$G$=gain around the feedback loop from the cathode of the tube 23 to the circuit point between the capacitors 14 and 16 around loop via the grid of the tube 22.

$$Z=\frac{V}{\dfrac{V(1+G)}{r \text{ (of resistor 67)}}}$$

$$Z=\frac{r \text{ (of resistor 67)}}{1+G}$$

in parallel with the resistance of the resistors 47 and 46.

The above calculation is based on maintaining the phase shift between the opposite ends of resistor 67 very close to 180°. This must be true over the entire frequency range of operation. If the phase shift departs from 180°, the impedance seen from the junction of capacitor 14 and capacitor 16 will develop an inductive or capacitive component. This is the reason for the use of capacitor 59 to correct the phase shift introduced by capacitor 63 and resistor 61. Capacitor 66 is used to block D.C. from getting to the junction between capacitors 14 and 16 and then to the grid of tube 22. However, the capacitive reactance of capacitor 66 must be very low with respect to the impedance of resistor 67 in order to minimize the phase shift. The phase shift and harmonic content is reduced by the feedback loop and this helps to maintain the phase shift relationship across resistor 67.

The following values for part of the circuit constants are given by way of example only. These values were those used in an oscillator constructed in accordance with this invention. The oscillator operated at 60 cycles per second:

| | |
|---|---|
| Resistor **46** | 220,000 ohms. |
| Resistor **47** | 33 megohms. |
| Resistor **61** | 150,000 ohms. |
| Resistor **38** | 500 ohm potentiometer. |
| Resistor **67** | 120,000 ohms. |
| Resistor **18** | 25,000 ohm potentiometer. |
| Resistor **24** | 1.5 megohms. |
| Resistor **43** | 5,000 ohms. |
| Resistor **58** | 3.9K ohms. |
| Resistor **28** | 560 ohms. |
| Resistor **26** | 33,000 ohms. |
| Capacitor **63** | 0.1 mfd. |
| Capacitor **59** | 1 mfd. |
| Capacitor **66** | 1 mfd. |
| Capacitor **12** | .01 mfd. |
| Capacitor **14** | .001 mfd. |
| Capacitor **16** | 1000 mmfd. |
| Tube **23** | 6CL6. |

What is claimed is:

1. A controlled oscillator system comprising an amplifying device having a cathode, an anode and a control electrode, means connecting said cathode to a reference potential for said oscillating system, connections including a phase reversing feedback loop having a plurality of cascade sections, each of said sections comprising capacitance and resistance for producing a phase delay, means coupling said feedback loop to said anode, said control electrode and said reference potential for said oscillator to provide for generation of oscillations, a second amplifying device having a cathode, an anode and a control electrode, means coupling said cathode of said second amplifying device to a point between two of said capacitances of said sections of said feedback loop whereby said second amplifying device effectively comprises the said resistance in one of said cascade sections of said feedback loop, said cathode of said second amplifying device being connected to said reference potential by way of a parallel combination of a resistor and a capacitor, a third amplifying device, a second feedback loop coupled to said point between said two capacitances of said first named feedback loop, said second feedback loop including said second and third named amplifying devices, means for applying a direct current control signal to said third named amplifying device whereby to control said third named amplifying device in conjunction with a signal appearing in said second named feedback loop, and capacitor means coupling said third named amplifying device to said control electrode of said second named amplifying device.

2. A controlled oscillator system comprising an amplifying device having a cathode, an anode, and a control electrode, means connecting said cathode to a reference potential for said oscillating system, connections including a phase reversing feedback loop having a plurality of cascade sections, each of said sections comprising capacitance and resistance for producing a phase delay, means coupling said feedback loop to said anode, said control electrode and said reference potential for said oscillator to provide for generation of oscillations, a second amplifying device having a cathode, an anode and a control electrode, means coupling said cathode of said second amplifying device to a point between two of said capacitances of said sections of said feedback loop whereby said second amplifying device effectively comprises the said resistance in one of said cascade sections of said feedback loop, said cathode of said second amplifying device being connected to said reference potential by way of a parallel combination of a resistor and a capacitor, variable gain amplifying means, means coupling said variable gain amplifying means to said point between said two capacitors means for applying a direct current control signal to said variable gain amplifying means and capacitor means coupling said third named amplifying device to said control electrode of said second named amplifying device.

3. A controlled oscillator system comprising an amplifying device having a cathode, an anode and a control electrode, means connecting said cathode to a reference potential for said oscillating system, connections including a phase reversing feedback loop having a plurality of cascade sections, each of said sections comprising capacitance and resistance for producing a phase delay, means coupling said feedback loop to said anode, said control electrode and said reference potential for said oscillator to provide for generation of oscillations, a second amplifying device having a cathode, an anode and a control electrode, means coupling said cathode of said second amplifying device to a point between two of said capacitances of said section of said feedback loop whereby said second amplifying device effectively comprises the said resistance in one of said cascade sections of said feedback loop, said cathode of said second amplifying device being connected to said reference potential by way of a parallel combination of a resistor and a capacitor, a third amplifying device, a second feedback loop coupled to said point between said two capacitances of said first named feedback loop said second feedback loop including said second and third named amplifying devices, a fourth amplifying device, means for applying a direct current control signal to said fourth amplifying device to vary the bias on said third named amplifying device whereby to control said third named amplifying device in conjunction with a signal appearing in said second named feedback loop, and capacitor means coupling said third named amplifying device to said control electrode of said second named amplifying device.

4. A controlled oscillator system comprising an electron discharge device having a cathode, an anode and a control electrode, means connecting said cathode to a reference potential for said oscillating system, connections including a phase reversing feedback loop having a plurality of cascade sections, each of said sections comprising capacitance and resistance for producing a phase delay, means coupling said feedback loop to said anode, said control electrode and said reference potential for said oscillator to provide for generation of oscillations, a second electron discharge device having a cathode, an anode and a control electrode, means coupling the cathode of said second discharge device to a point between two of said capacitances of said sections of said feedback loop whereby said second discharge device controls phase delay in one of said cascade sections of said feedback loop, said cathode of said second electron discharge device being connected to said reference potential by way of a parallel combination of a resistor and a capacitor, a third electron discharge device, a second feedback loop coupled to said point between said two capacitances of said first named feedback loop, said second feedback loop including said second and third named discharge devices, and means for applying a control signal to said third named discharge device whereby to control said third named discharge device in conjunction with a signal appearing in said second named feedback loop.

References Cited in the file of this patent

UNITED STATES PATENTS 2,777,951 Charlton ------------ Jan. 15, 1957